United States Patent
Han

(10) Patent No.: US 7,122,476 B2
(45) Date of Patent: Oct. 17, 2006

(54) METHOD FOR FABRICATING SEMICONDUCTOR DEVICE BY FORMING TRENCHES IN DIFFERENT DEPTHS AT A CELLREGION AND A PERIPHERAL REGION FOR REDUCING SELF ALIGNED SOURCE RESISTANCE AT THE CELL REGION

(75) Inventor: Chang Hun Han, Icheon (KR)

(73) Assignee: Dongbu Electronic Co., Ltd., Seoul (KR)

( * ) Notice: Subject to any disclaimer, the term of this patent is extended or adjusted under 35 U.S.C. 154(b) by 0 days.

(21) Appl. No.: 10/952,161

(22) Filed: Sep. 29, 2004

(65) Prior Publication Data
US 2005/0074938 A1 Apr. 7, 2005

(30) Foreign Application Priority Data
Oct. 1, 2003 (KR) ............. 10-2003-0068495

(51) Int. Cl.
*H01L 21/311* (2006.01)
(52) U.S. Cl. .................................. 438/701
(58) Field of Classification Search ........ 438/424–428, 438/400, 689, 700, 701
See application file for complete search history.

(56) References Cited

U.S. PATENT DOCUMENTS

| | | | |
|---|---|---|---|
| 5,120,671 A | 6/1992 | Tang et al. | |
| 5,776,817 A * | 7/1998 | Liang | 438/427 |
| 6,008,120 A * | 12/1999 | Lee | 438/634 |
| 6,306,737 B1 | 10/2001 | Mehrad et al. | |
| 6,436,765 B1 | 8/2002 | Liou et al. | |
| 6,624,022 B1 * | 9/2003 | Hurley et al. | 438/256 |
| 6,724,062 B1 * | 4/2004 | Akahori et al. | 257/448 |
| 6,849,518 B1 * | 2/2005 | Parat et al. | 438/424 |
| 6,864,152 B1 * | 3/2005 | Mirbedini et al. | 438/427 |
| 6,949,801 B1 * | 9/2005 | Parat et al. | 257/374 |
| 6,979,628 B1 * | 12/2005 | Kim et al. | 438/427 |
| 6,995,095 B1 * | 2/2006 | Yu | 438/750 |
| 2004/0092115 A1 * | 5/2004 | Hsieh et al. | 438/694 |
| 2005/0009374 A1 * | 1/2005 | Gao et al. | 438/796 |
| 2005/0070107 A1 * | 3/2005 | Shinohara | 438/689 |

FOREIGN PATENT DOCUMENTS

KR 2003-0049783 6/2003

OTHER PUBLICATIONS

Wolf et al., Silicon Processing for the VLSI Era, vol. 1-Process Technology, Second Edition, Lattice Press, 2000, pp. 191-194.*

* cited by examiner

*Primary Examiner*—Scott B. Geyer
(74) *Attorney, Agent, or Firm*—Pillsbury Winthrop Shaw Pittman LLP

(57) ABSTRACT

In order to reduce the SAS resistance at the cell region with low process cost, a method for fabricating a semiconductor device according to the present invention includes forming a protection layer on a semiconductor substrate on which a cell region and a peripheral region are defined, forming a first trench and a second trench at the respective cell and the peripheral regions by selectively etching the protection layer and the semiconductor substrate, and deepening the second trench by further etching the peripheral region while the cell region being blocked and the peripheral region being exposed.

10 Claims, 6 Drawing Sheets

METHOD FOR FABRICATING SEMICONDUCTOR DEVICE BY FORMING TRENCHES IN DIFFERENT DEPTHS AT A CELLREGION AND A PERIPHERAL REGION FOR REDUCING SELF ALIGNED SOURCE RESISTANCE AT THE CELL REGION

RELATED APPLICATIONS

The current Application claims priority from Korean Application 10-2003-0068495, filed Oct. 1, 2003, the entire contents of which is hereby incorporated by reference.

BACKGROUND OF THE INVENTION (a) Field of the Invention

The present invention relates to a method for fabricating a semiconductor device and, in particular to a process for forming trenches in different depths at a cell region and a peripheral region for reducing SAS resistance at the cell region.

(b) Description of the Related Art

Recently, as flash memories are widely utilized and price competition grows, various technologies have been developed for reducing the sizes of the devices. One of those is a self aligned source (SAS) technique.

The SAS technique is a method for reducing the cell size in a bit line direction and is essentially adopted for below-0.25 µm line width technology since it can reduce a gap between the gate and the source such that the cell size can be reduced about 20% with the introduction of the SAS technique.

However, the conventional SAS technique has a drawback in that contact resistance of the source per cell dramatically increases because the SAS region is formed along the trench profile.

In the meantime, the below-0.25 µm or below-0.18 µm technology is utilized together with a shallow trench isolation (STI) technique for fabricating the most semiconductor devices.

That is, the STI technique and the SAS technique are essential to reduce the cell size in a word line direction and a bit line direction, respectively. However, simultaneous adaptation of these two techniques causes to dramatically increase the source resistance.

Especially, in case of the flash memory the reduction of the cell size causes to increase the depth of the trench since it uses high internal voltage, resulting in deterioration of the source resistance.

FIG. 1 is a graph illustrating variation of the source resistance according to a trench depth. As shown in FIG. 1, in case of the trench depth of 2400 Å the resistance per cell is 510 Ohm. In the meantime, in case of 3600 Å the resistance per cell becomes about 880 Ohm.

Conventional flash memory and SAS-related technologies have been disclosed in the U.S. Pat. No. 6,306,737, the U.S. Pat. No. 6,436,765, and the U.S. Pat. No. 5,120,671.

Since the trench depth of the 0.18 technology flash memory cell is 3500 Å, it dramatically degrades the source resistance. In order to solve this problem, mask processes for forming isolation structures are separately carried out at the cell region and the peripheral region.

In this method, the trenches are formed at different depths for the cell region and the peripheral region. For example, the trench is formed at a depth of about 3500 Å for the cell region and at a shallow depth of about 1800 Å for the peripheral.

In order to form the trenches at different depths for the cell and peripheral regions, a photolithography process using a deep ultra violet (DUV) light source is separately adopted at the cell region and the peripheral region.

The conventional technique will be described hereinafter with reference to the accompanying drawings.

As shown in FIG. 2a, firstly, a pad oxide layer 110, a pad nitride layer 120, and a dielectric layer 130 which is used as a hard mask are sequentially deposited on a semiconductor substrate 100. In order to simplify the explanation, the semiconductor substrate 100 is divided into a cell region (C) and a peripheral region (P).

Next, in order to form a trench a first DUV photoresist pattern 140 is prepared in a state that the entire peripheral region (P) is blocked and the cell region (C) is exposed at a predetermined width.

Next, as shown in FIG. 2b, one trench (Tc) is formed by sequentially etching the dielectric layer 130, the pad nitride layer 120, the pad oxide layer 110, and the semiconductor substrate 100 in the cell region exposed using the first DUV photoresist pattern 140 as a mask. The trench (Tc) is formed inside the cell region at a required shallow depth.

Next, as shown in FIG. 2c, another trench (Tp) is formed by sequentially etching the dielectric layer 130, the pad nitride layer 120, the pad oxide layer 110, and the semiconductor substrate 100 in the peripheral region (P) exposed using a second DUV photoresist pattern 150 which blocks the entire cell region (C).

Here, the trench (Tp) which is formed in the peripheral region (P) is formed so as to be deeper than the trench (Tc) formed in the cell region (C).

In this conventional method using the DUB light source, the etching process is applied to the cell and peripheral regions separately using the first and second DUV photoresist patterns, respectively.

However, the conventional method has drawbacks in that the mask or reticle and the photoresist, which are used for a fine linewidth processing technique with the short wavelength such as DUV in the isolation process, are very expensive so as to increase the entire manufacturing costs. Accordingly, it is required to develop an improved technique for reducing the manufacturing costs.

SUMMARY OF THE INVENTION

The present invention has been made in an effort to solve the above problem and it is an object of the present invention to provide a SAS technique capable of avoiding the increase of the resistance.

It is another object of the present invention to provide a SAS technique which is capable of avoiding resistance increment by forming trenches at different depths in cell and peripheral regions using a cost effective photolithography process.

In order to achieve the above objects, a method for fabricating a semiconductor device the present invention includes forming a protection layer on a semiconductor substrate on which a cell region and a peripheral region are defined, forming a first trench and a second trench at the respective cell and the peripheral regions by selectively etching the protection layer and the semiconductor substrate, and deepening the second trench by further etching the peripheral region while the cell region being blocked and the peripheral region being exposed.

The second trench is deepened through a photolithography process using a light source of which wavelength is longer than that of a light source used at the step of forming the first and second trenches. The first and second trenches are formed through photolithography process using a deep ultra violet (DUB) as the light source and then the second trench is deepened through a photolithography process using an i-line as the light source.

Preferably, the first and second trenches are formed by carrying out etch process using a photoresist pattern exposing the protection layer of the cell and peripheral regions at a predetermined width as a mask and then the photoresist pattern after the step of forming the first and second trenches is removed.

Preferably, the second trench is deepened through an etching process using the protecting layer on the peripheral region as a mask.

Preferably, the protection layer is a tetra ethyl ortho silicate (TEOS) oxide layer.

The method further includes forming a pad oxide layer and a pad nitride layer on the semiconductor substrate sequentially, the protection layer being preferably formed on the pad nitride layer.

DETAILED DESCRIPTION OF THE PREFERRED EMBODIMENTS

A preferred embodiment of the present invention will be described hereinafter with reference to the accompanying drawings.

The SAS technique is a method for reducing the cell size in the bit line direction and is essentially adopted for below-0.25 μm linewidth technology since it can reduce a distance between the gate and the source.

Typically, a NOR type flash memory uses a common source scheme and one contact is formed per 16 cells.

Figure 1:
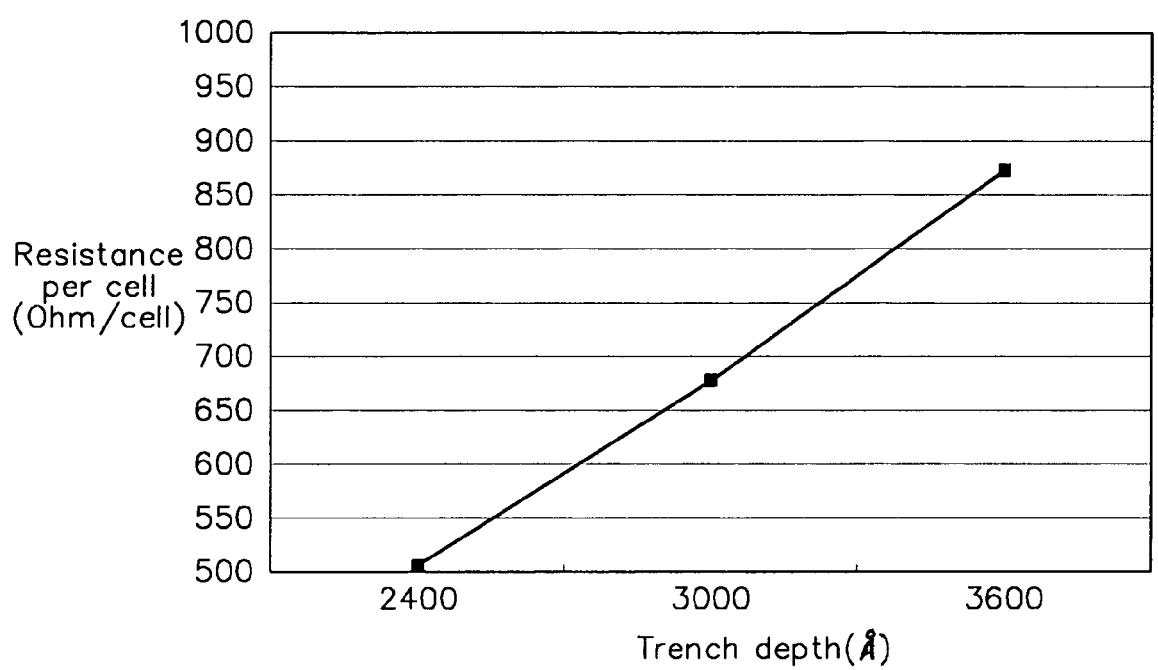
FIG. 1 is a graph illustrating variation of the source resistance according to a depth of trench
Figure 2A:
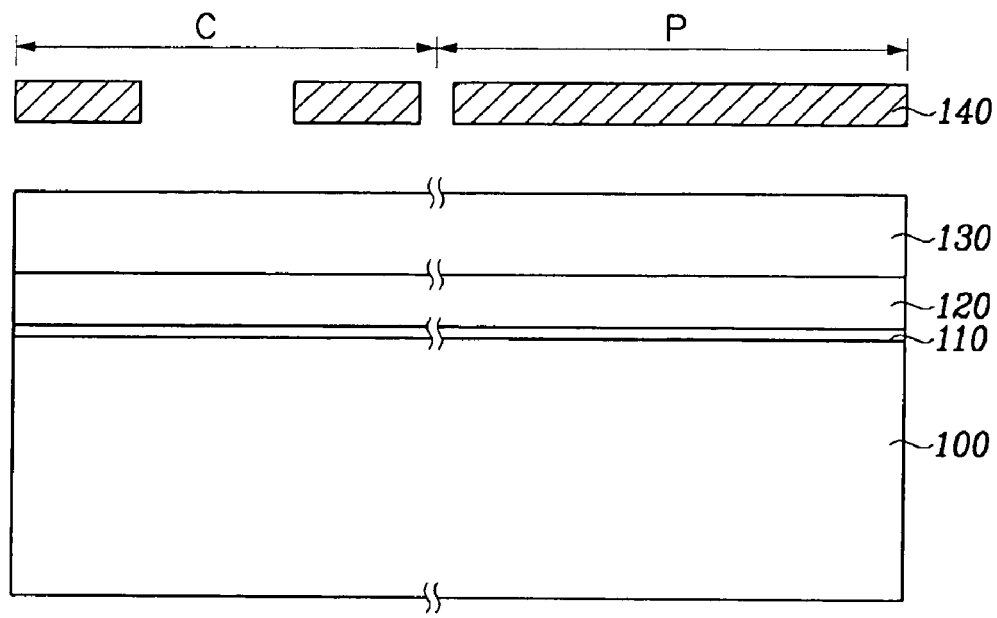
FIG. 2a to FIG. 2c are cross sectional views illustrating fabricating steps of a conventional semiconductor device having trenches of which depths are different from each other at respective cell and peripheral region.
Figure 2B:
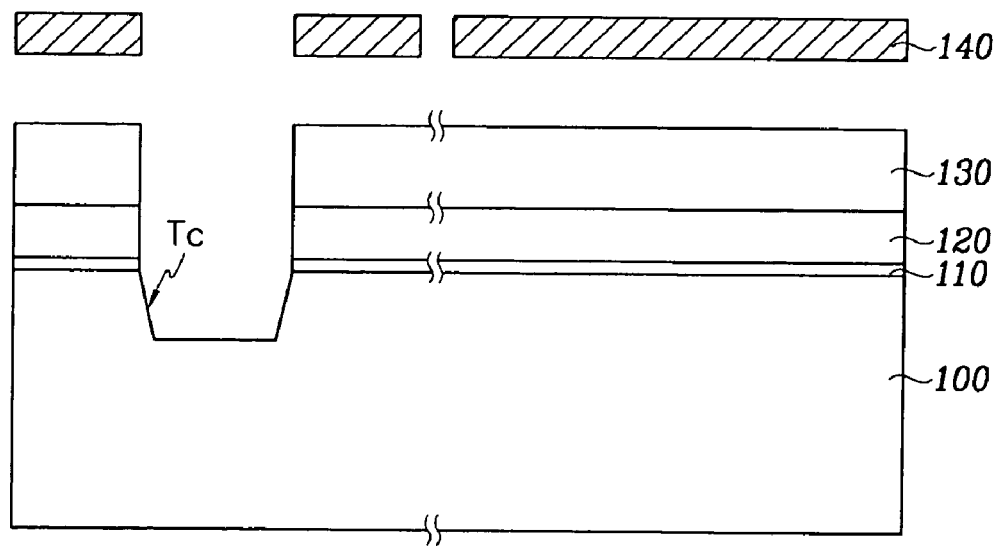
Figure 2C:
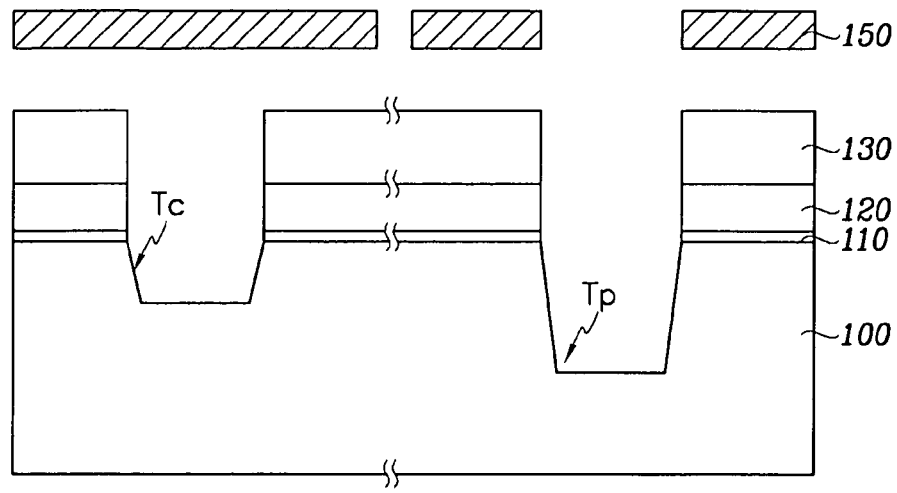
Figure 3A:
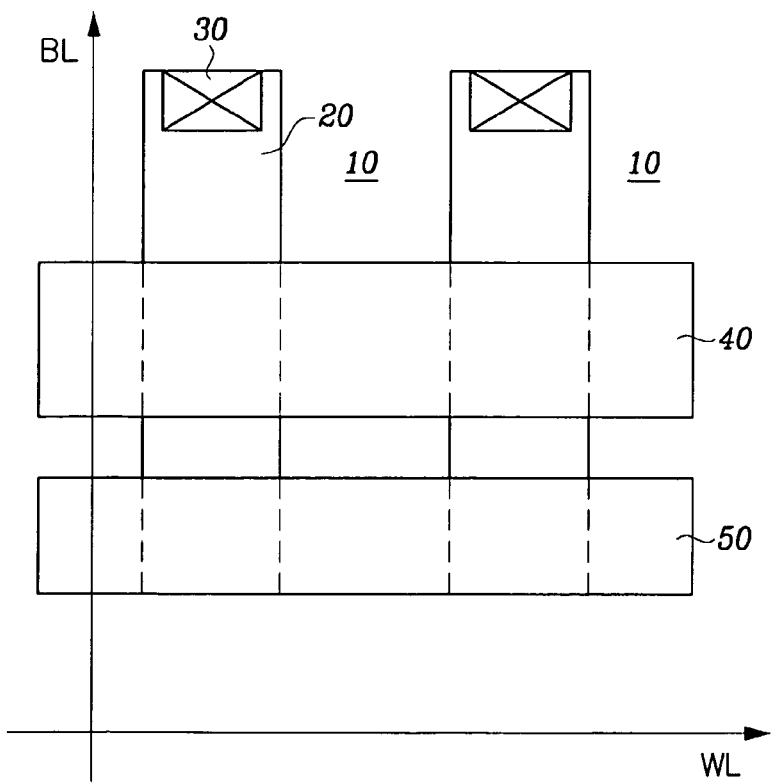
FIG. 3a is a plane view illustrating a conventional memory cell without introducing the SAS technique.
Figure 3B:
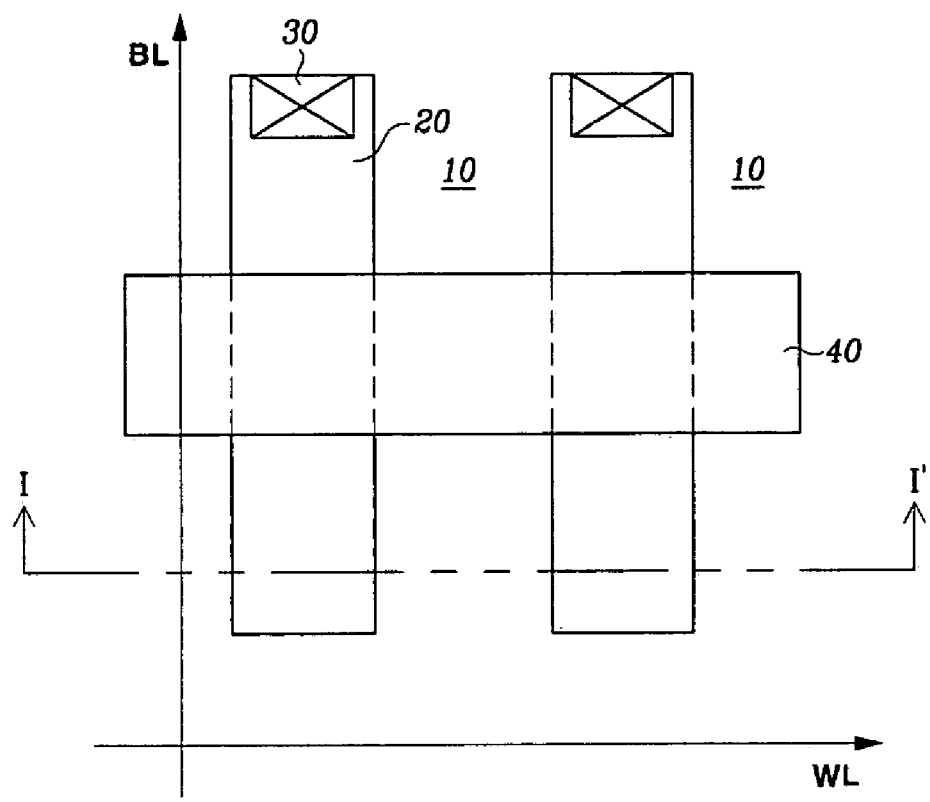
FIG. 3b is a plane view illustrating a memory cell introducing the SAS technique.
Figure 3C:
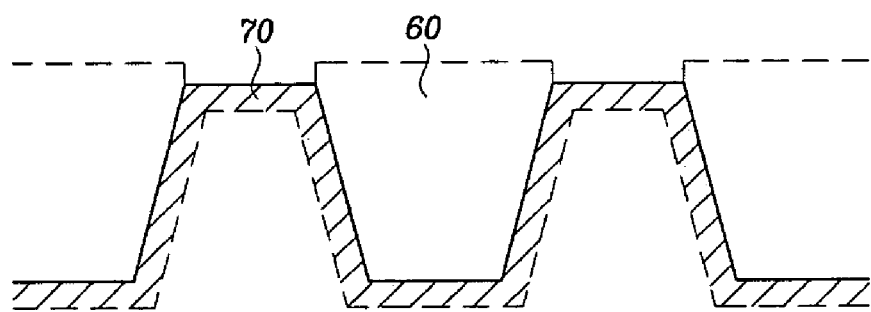
FIG. 3c is a cross sectional view taken along line I–I' in FIG. 3b.

FIG. 3a is a plane view illustrating a conventional memory cell without introducing the SAS technique, FIG. 3b is a plane view illustrating a memory cell introduced the SAS technique, and FIG. 3c is a cross sectional view taken along line I–I' in FIG. 3b.

In FIG. 3a, field oxide regions 10 as device isolation regions are formed in a bit line (BL) direction, and active regions 20, in which devices are formed, are defined between the field oxide regions 10. A drain contact 30 is formed at each cell of the active region 20.

A gate line 40 is formed in a word line (WL) direction, and a common source line 50 is formed in parallel with the gate line 40 at a predetermined distance.

By introducing the SAS technique for forming the memory cell, as shown in FIG. 3b and FIG. 3c, a SAS region 70 is formed by implanting impurity ions after etching the field oxide region 60 formed in an area which corresponds to the typical common source line 50.

Since the SAS region 70 is formed along the trench profile, the contact resistance of the source per cell increases dramatically. The increase of the resistance is because the actual surface resistance extends along the trench profile and the resistivity of the sidewall in the trench increases.

The STI technique and the SAS technique are essential to reduce the cell size in the word line direction and the bit line direction, respectively. However, simultaneous adaptation of these two techniques causes to dramatically increase the source resistance.

Typically, in case that the SAS technique is adopted in a local oxidation of silicon (LOCOS) structure, the source resistance per cell is 300 Ohm, however, it decreases to the extent of 1000 Ohm in the STI structure.

In this case, during the programming and reading operations of the flash memory cell, high source resistance occurs to cause a current drop (IR drop) and the voltage of the source terminal increases such that programming and reading efficiency is degraded, resulting in malfunctioning of the device.

In more detail, the source contact is formed per 16 cells when the resistance per cell increases such that the IR drop occurs between the first and eighth cells, thereby back bias changes to some extent, resulting in reading operation error.

Especially, in case of flash memory the reduction of the cell size causes to increase the depth of the trench since it uses high internal voltage, resulting in deterioration of the source resistance.

In order to solve this problem, mask process for forming the isolation structure is separately carried out to the cell region and the peripheral region so as to form the trenches at the cell region and the peripheral region at different depths. For example, the trench is formed at the depth of 3500 Å, which is relatively deep, in the peripheral region and 1800 Å, which is relatively shallow, in the cell region.

A method for forming the trenches, at different depths, in the cell and peripheral regions will be described hereinafter with reference to the accompanying drawings in detail.

Figure 4A:
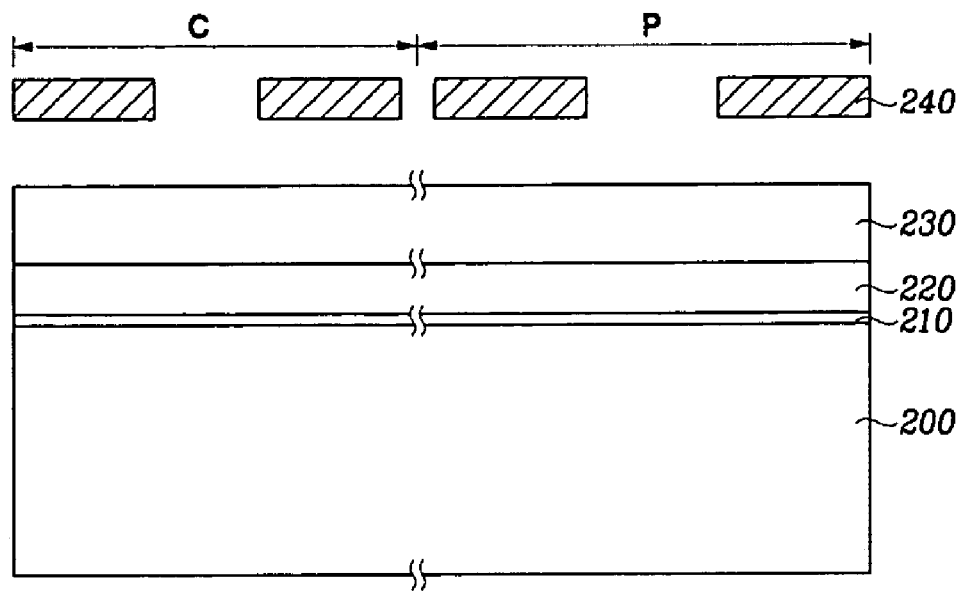
FIG. 4a to FIG. 4d are cross sectional views illustrating fabricating steps of a semiconductor device having trenches of which depths are different from each other at respective cell and peripheral region according to a preferred embodiment of the present invention.

Firstly, as shown in FIG. 4a, a pad oxide layer 210, a pad nitride layer 220, and a dielectric layer 230 to be used as a hard mask are sequentially formed on the semiconductor substrate 200. To simplify the explanation, the semiconductor substrate is divided into a cell region (C) and a peripheral region (P).

The dielectric layer 230 can be made from a TEOS oxide layer and acts for preventing the semiconductor substrate from being etched while forming the trench of the peripheral region (P) deeply in the following process.

Next, in order to define the cell region and the peripheral region a first photoresist pattern 240 is prepared. The first photoresist pattern 240 is preferably prepared so as to be used at a photolithography process with a light source of short wavelength such as DUV for defining a fine pattern.

Figure 4B:
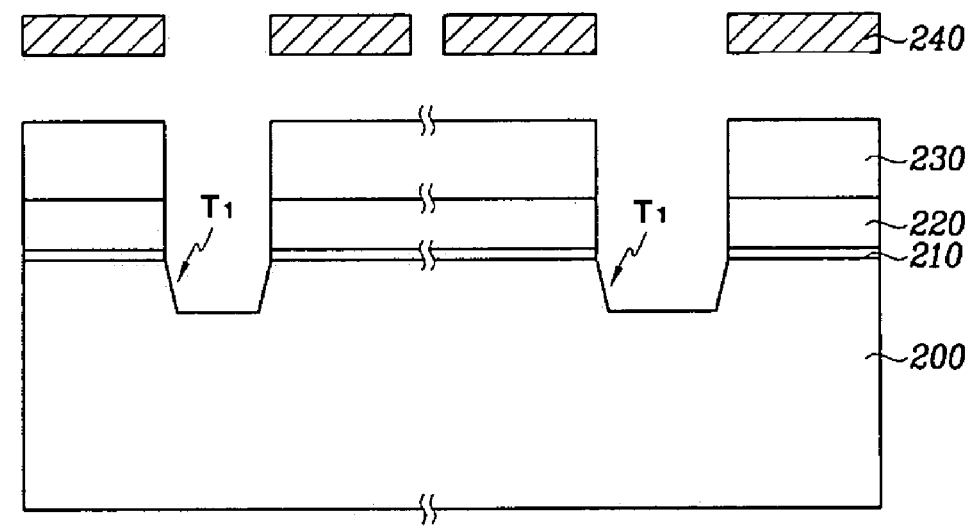

That is, as shown in FIG. 4b, trenches (T1) of the cell region and the peripheral region are simultaneously formed by sequentially etching the dielectric layer 230, the pad nitride layer 220, the pad oxide layer 210, and the semiconductor substrate 200 at areas exposed inside the cell region (C) and the peripheral region (P) using the first photoresist pattern 240 as a mask and the DUV as a light source. The trenches (T1) are formed at a depth required at the cell region.

Figure 4C:
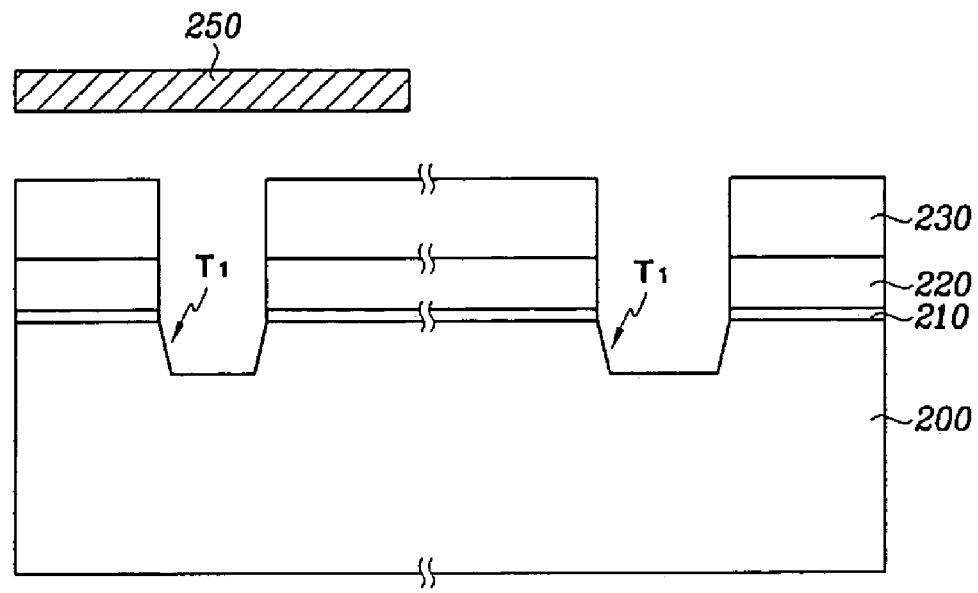

Next, as shown in FIG. 4c, the first photoresist pattern 240 is removed, and then prepares a second photoresist pattern 250 which blocks the entire cell region (C) and exposes the entire peripheral region (P).

Here, even though the trench of the peripheral region is completely formed at the required depth, it is allowed to expose the entire peripheral region rather than to expose only the area predetermined for the trench since the trench is defined at the required area. Accordingly, the second photoresist pattern 250 is formed to expose the entire peripheral region, such that an arrangement process for exposing specific area to be formed as the trench is not required, resulting in a process margin.

Figure 4D:
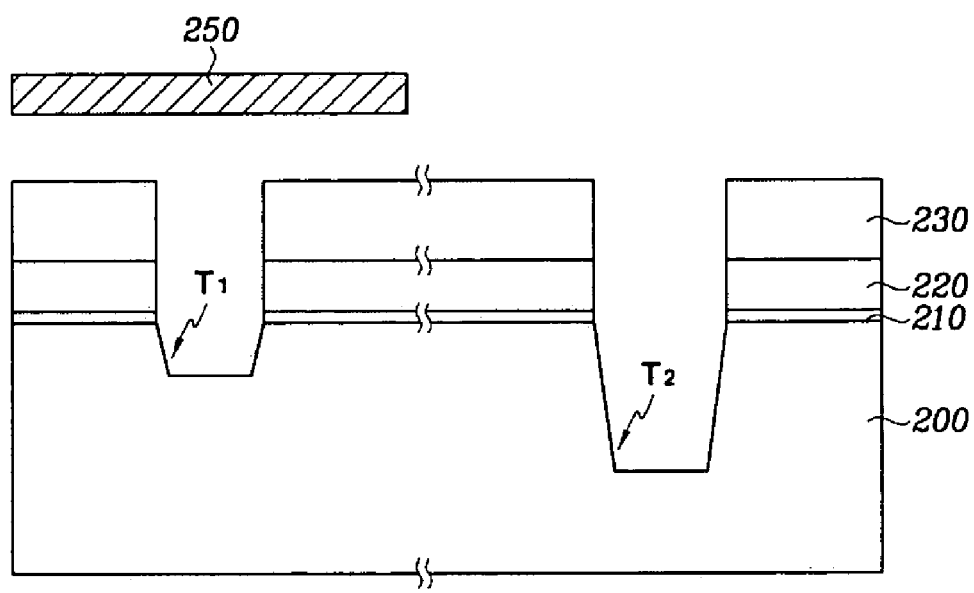

Next, as shown in FIG. 4d, the semiconductor substrate 200 is further etched in the peripheral region (P) using a light source such as i-line having a relatively long wavelength and using the second photoresist pattern 250 as a mask so as to form the trench (T2) having a required depth.

Since the trench area is defined at the previous process of FIG. 4b, the purpose of this process is to further etch the semiconductor substrate at the peripheral region (P) to make the trench deeper. Accordingly, it is allowable to use a light source having long wavelength such as general purpose i-line rather than the expensive light source having short wavelength such as DUV.

In this manner, the trenches T1 and T2 having different depths can be formed in the cell region (C) and the peripheral region (P), respectively.

As described above, since trenches are formed at different depths in the cell region and the peripheral region according to the present invention, it is possible to solve the problem of the increment of the source resistance when adopting the SAS technique. Furthermore, by reducing the number of the photolithography processes using the DUV light source for forming the trenches at the cell and peripheral regions in different depth the present invention is advantageous to reduce the entire manufacturing costs.

Also, the present invention is advantageous to secure the process margin, since the number of the alignment processes for forming the photoresist pattern exposing the area to be formed as the trench is reduced and, especially, the entire peripheral region is exposed and the entire cell region is blocked in the process for making the trench deeper.

What is claimed is:

1. A method for fabricating a semiconductor device, comprising:

sequentially forming a pad oxide layer, a pad nitride layer and a dielectric protection layer on a semiconductor substrate on which a cell region and a peripheral region are defined;

simultaneously forming a first trench and a second trench at the respective cell and the peripheral regions by selectively etching the protection layer and the semiconductor substrate; and deepening the second trench by further etching the peripheral region while the cell region being blocked and the peripheral region being exposed, wherein deepening the second trench is carried out through a photolithography process using a light source of which wavelength is longer than that of a light source used at forming the first and second trenches and the pad nitride layer is directly formed on the pad oxide layer.

2. The method of claim 1, wherein forming the first and second trenches is carried out using a photoresist pattern exposing the protection layer of the respective cell and peripheral regions at a predetermined width as a mask.

3. The method of claim 2, further comprising removing the photoresist pattern after forming the first and second trenches.

4. The method of claim 1, wherein deepening the second trench is carried out through an etching process using the protection layer on the peripheral region as a mask.

5. The method of claim 1, wherein the protection layer is a tetraethylorthosilicate (TEOS) oxide layer.

6. A method for fabricating a semiconductor device, comprising:

sequentially forming a pad oxide layer, a pad nitride layer and a dielectric protection layer on the semiconductor substrate on which a cell region and a peripheral region are defined;

simultaneously forming a first trench and a second trench at the respective cell and the peripheral regions by selectively etching the protection layer and the semiconductor substrate; and deepening the second trench by further etching the peripheral region while the cell region being blocked and the peripheral region being exposed, wherein forming the first and second trenches is carried out using a deep ultra violet (DUV) as the light source and deepening the second trench is carried out using an i-line as the light source and the pad nitride layer is directly formed on the pad oxide layer.

7. The method of claim 6, wherein forming the first and second trenches is carried out using a photoresist pattern exposing the protection layer of the respective cell and peripheral regions at a predetermined width as a mask.

8. The method of claim 7, further comprising removing the photoresist pattern after forming the first and second trenches.

9. The method of claim 6, wherein deepening the second trench is carried out through an etching process using the protection layer on the peripheral region as a mask.

10. The method of claim 6, wherein the protection layer is a tetraethylortho silicate (TEOS) oxide layer.

* * * * *